US005647005A

United States Patent [19]

Wang et al.

[11] Patent Number: 5,647,005

[45] Date of Patent: Jul. 8, 1997

[54] PITCH AND RATE MODIFICATIONS OF AUDIO SIGNALS UTILIZING DIFFERENTIAL MEAN ABSOLUTE ERROR

[75] Inventors: Yen-Hui Wang; Der-Chwan Wu, both of Hsinchu, Taiwan

[73] Assignee: Electronics Research & Service Organization, Hsinchu, Taiwan

[21] Appl. No.: 494,277

[22] Filed: Jun. 23, 1995

[51] Int. Cl.$^{6}$ .................................................. H03G 3/00

[52] U.S. Cl. .............................. 381/62; 381/61; 381/101; 381/98; 84/654; 84/604

[58] Field of Search ................................ 84/DIG. 9, 681, 84/626, 669, 630, 670, 662, 707, 654, 604, 605; 381/61, 101, 102, 104, 107, 106, 62, 63

[56] References Cited

U.S. PATENT DOCUMENTS 4,483,229 11/1984 Tsukamoto ................................ 84/605
5,065,432 11/1991 Sasaki ........................................ 381/61
5,131,042 7/1992 Oda ........................................... 84/605

*Primary Examiner*—Minsun Oh
*Attorney, Agent, or Firm*—Barnes, Kisselle, Raisch, Choate, Whittemore & Hulbert, P.C.

[57] ABSTRACT

A method is disclosed of modification of parameters of audio signals by dividing a digital signal converted from an original analog signal into sound frames, modifying a pitch and a playing rate of the digital signal within a frame and subsequent successive splicing a last modified frame with a first non-modified frame and calculating a differential mean absolute error to define the best splicing point in terms of producing minimal or no audible noise such that various sections of sound signals can be spliced together to achieve pitch and playing rate modification. An apparatus is also disclosed for implementing the method, the apparatus comprising input and output amplifiers, a low pass filter at the input and a low pass filter at the output, analog-to-digital and digital-to-analog converters, and a pitch shifting processor.

13 Claims, 3 Drawing Sheets

PITCH AND RATE MODIFICATIONS OF AUDIO SIGNALS UTILIZING DIFFERENTIAL MEAN ABSOLUTE ERROR

FIELD OF THE INVENTION

The present invention is generally related to algorithms for pitch and playing rate modifications of audio signals and more particularly, relates to high efficiency algorithms for the pitch and rate modification of audio signals by calculating the mean absolute error to find the best splicing point such that various sections of sound signals can be spliced together to achieve pitch and rate modifications.

BACKGROUND OF THE INVENTION

In audio signal recordings, efforts have been made to modify the pitch and playing rate of sound signals in specific audio applications. For instance, modifications have been attempted in various applications such as in the use of a sampling synthesizer, a harmonizer, a vocoder, a language learning machine, a telephone answering machine, and software for computer synthesized music. When modification of human vocal signals is desired, a compression technique has been used to modify the sound signals according to the pitch of the singer to adjust the amplitude of the signals. In general, the modification range of the amplitude of an adjustable input sound signal is within an octave. The sound signals can be adjusted in a total of 24 halftones including 12 descending halftones and 12 ascending halftones. The modification must match the demand for the real time handling of data by relatively simple hardware design. It must also avoid any detectable distortions of the sound.

Traditionally, a segregation and splicing method utilizing resampling and formatting for the modification of sound signals has been adopted. However, this modification method produces an unacceptable level of sound distortion. The technique of resampling centers on changing the sampling frequency such that it not only changes the amplitude of the sound signal but also changes the signal length and the shape of the format envelope. In order to maintain the original signal length, other workers have performed the compression and expansion technique after resampling of the sound signals. However, these compression/expansion steps frequently produce short durations of pop noise. Furthermore, the changing of the shape of the format envelope produces high pitch noise. The segregation/splicing method utilizes a linear prediction filter and Fourier transformation to maintain the shape of the format, however, the calculation steps required are very extensive. Still other workers have utilized oscillators and filter banks for the modification of sound pitch. These methods produce low frequency and high frequency noises and furthermore, require multiple steps of calculation.

It is therefore an object of the present invention to produce a method for modification of the pitch and playing rate of sound signals that does not have the shortcomings of the prior art methods.

It is another object of the present invention to provide a method for modification of the pitch and playing rate of sound signals by calculating the mean absolute error of the sound signals for the determination of an optimum splicing point.

It is a further object of the present invention to provide a method for modification of the pitch and playing rate of sound signals by calculating the mean absolute error of the signals by incorporating a block binary search method.

SUMMARY OF THE INVENTION

In accordance with the objects declared in the above, in the first aspect of the invention, there is provided a method of modifying parameters of audio signals, in which an analog audio signal is first converted into a digital signal. Then, the digital signal is divided into sound frames, and a pitch and playing rate of the digital signal are modified within a frame. The so modified sound frame is then spliced with a non-modified sound frame in such a way that the non-modified sound frame overlaps, for cross fading, an end region of the modified sound frame. The overlapping is performed with a portion of the frame which has a similarity in sound structure to the end region. The similarity in sound structure is established by defining a differential mean absolute error of splicing requiring a least number of steps of calculation according to a function $$\begin{aligned} DMAE &= \sum_{m} |x_1(m) - x_2(m+\tau)| + \\ &\quad |x_1(m+1) - x_1(m) - x_2(m+1+\tau) - x_2(m+\tau)| \\ &= \sum_{m} |x_1(m) - x_2(m+\tau)| + \\ &\quad |x_1(m+1) - x_2(m+1+\tau) - [x_1(m) + x_2(m+\tau)]| \end{aligned}$$

where DMAE is the differential mean absolute error of splicing; m is any combination sum of points between 0 and cs, where cs is a cross fading size; $0 \leqq \tau < sr$, where sr is a search region; $x_1$ refers to the modified frame and $x_2$ refers to the non-modified frame. The modifying and splicing steps are repeated for the mentioned non-modified sound frame and also for remaining non-modified sound frames of the digital signal to obtain a modified digital signal. Finally, the modified digital signal is converted back into an analog form.

Where the step of modifying results in longer sound frames, excessive non-modified sound frames are discarded to preserve the playing time unchanged. On the other hand, where the step of modifying results in shorter sound frames, deficient sound frames are taken from the original digital signal to preserve the playing time unchanged.

The DMAE is defined in points $n\tau$ apart from each other, n is integer and depends on an allowable range of accuracy in calculations. The search region is divided into a number of sections, to further define the DMAE for each of the sections, compare the defined DMAEs to each other, and to choose a section with a smallest DMAE as an optimum splicing location.

The number of calculations required for locating the section with a smallest DMAE is $$n[3+2(\log_2 MS/n-2)]$$

where n is the number of sections, MS is the length of the search region.

According to the second aspect of the invention, a method of modifying parameters of audio signals is provided, in which an analog audio signal is first converted into a digital signal. Then, the digital signal is divided into sound frames, and a playing time of a frame is modified. The so modified sound frame is then spliced with a non-modified sound frame in such a way that the non-modified sound frame overlaps, for cross fading, an end region of the modified sound frame. The overlapping is performed with a portion of the frame which has a similarity in sound structure to the end region. The similarity in sound structure is established by defining a differential mean absolute error of splicing requiring a least number of steps of calculation according to a function $$\begin{aligned} DMAE &= \sum_m |x_1(m) - x_2(m+\tau)| + \\ &\quad |x_1(m+1) - x_1(m) - x_2(m+1+\tau) - x_2(m+\tau)| \\ &= \sum_m |x_1(m) - x_2(m+\tau)| + \\ &\quad |x_1(m+1) - x_2(m+1+\tau) - [x_1(m) + x_2(m+\tau)]| \end{aligned}$$

where DMAE is the differential mean absolute error of splicing; m is any combination sum of points between 0 and cs, where cs is a cross fading size; $0 \leqq \tau < sr$, where sr is a search region; $x_1$ refers to the modified frame and $x_2$ refers to the non-modified frame. The modifying and splicing steps are repeated for the mentioned non-modified sound frame and also for remaining non-modified sound frames of the digital signal to obtain a modified digital signal. Finally, the modified digital signal is converted back into an analog form.

Also, where audio signal processing involves increasing amplitude of the audio signal, the modifying step of changing playing time includes increasing thereof to thereby maintain a playing rate and amplitude of the audio signal unchanged. Accordingly, where audio signal processing involves decreasing amplitude of the audio signal, the modifying playing time includes decreasing thereof to thereby maintain a playing rate and amplitude of the audio signal unchanged.

The DMAE is defined in points $n\tau$ apart from each other, n is integer and depends on an allowable range of accuracy in calculations. The search region is divided into a number of sections, to further define the DMAE for each of the sections, compare so defined DMAEs to each other, and to choose a section with a smallest DMAE as an optimum splicing location.

The number of calculations required for locating the section with a smallest DMAE is $$n[3+2(\log_2 MS/n-2)]$$

where n is the number of sections, MS is the length of the search region.

An apparatus for modifying parameters of audio signals is provided. According to the present invention, it comprises an input amplifier and an output amplifier, a first and a second low pass filters, an analog-to-digital converter, a digital-to-analog converter, and a pitch shifting processor. The input amplifier, first low pass filter, and analog-to-digital converter are connected in series and are input to the pitch shifting processor, whereas the digital-to-analog converter, the second low pass filter, and the output amplifier are connected in series at the output of the pitch shifting processor.

The pitch shifting processor comprises an input unit connected with an input buffer, an output unit connected with an output buffer, a cross fading data memory for storing portions of audio signals that require cross fading, an address unit connected with the input and output buffers and the cross fading data memory, a register file unit, a digital processing unit for calculating mean absolute error and cross fading value, and a control unit. The input buffer, cross fading data memory, register file unit, digital processing unit, control unit, and output buffer are operatively interconnected through a bus system.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENT

In accordance with the present invention, a method of modifying the pitch and the playing rate of sound signals without the shortcomings of the prior art methods is provided.

Figure 1:
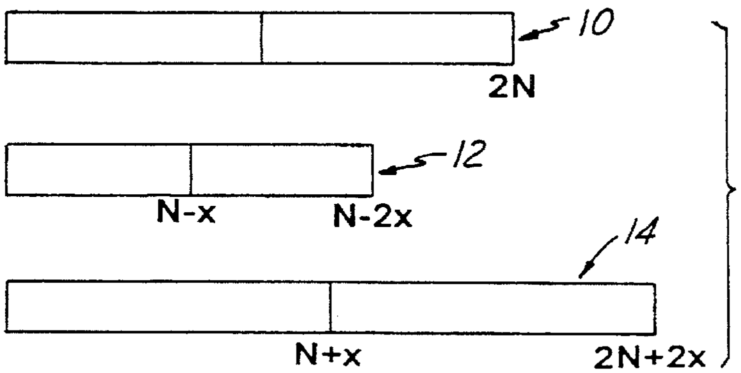
FIG. 1 is a graph illustrating sound signals played at the same playing rate with increased and decreased sampling points.

The simplest method for modifying the pitch of a sound signal is to produce the same effect as if playing a tape recorder at a higher speed or at a lower speed. This effect can be produced by two different methods. First, if the playing rate is kept constant, the sampling points can be proportionally decreased or increased. This is shown in FIG. 1. The original sound signal is illustrated as 10. The sound signal 12 illustrates that the sampling points have been proportionally reduced in order to achieve the effect of a faster played sound. The sound signal 14 illustrates the condition where the sampling points have been proportionally increased in order to produce the effect of playing the sound at a slower speed. The second method is to keep the sampling points constant while increasing or decreasing the playing rate. This method is similar to the principle of playing a tape recorder at a higher speed or at a lower speed. However, one drawback produced by either one of the methods is that the resulting playing time is changed. In order to correct this problem, a duplicate/discard method of modifying sound signals can be utilized to first divide a continuing sound signal into several sections called sound frees. In a situation where the amplitude is decreased which results in a longer sound free, the excessive sound signal will be discarded. On the other hand, if the amplitude is increased which results in a shorter sound frame, the deficient portion of the sound signal may be filled in by other sections of sound frames. By using this technique, the length of each sound frame can be maintained at a constant value.

Figure 2:
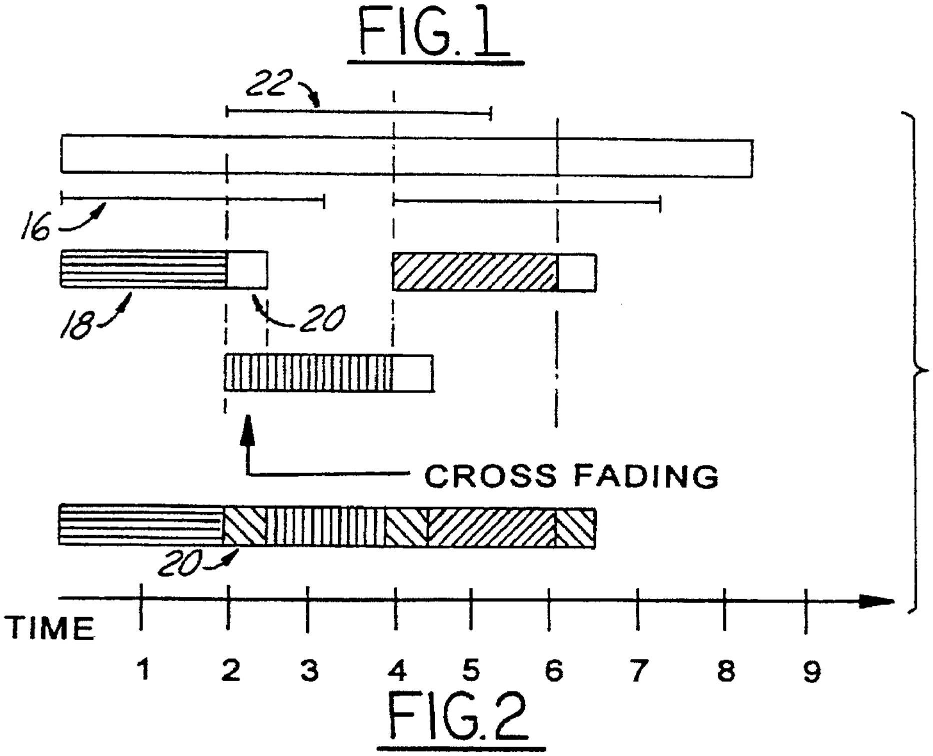
FIG. 2 is a diagram illustrating the present invention sound frame splicing method for increasing the sound scale.

For further illustration, the method of filling-in sound signals having deficient length by other sound frames can be executed as follows. For a sound frame having a playing time length of M ms (milliseconds), if the pitch has been increased by increasing the frequency to x times, the playing time of the sound is shortened resulting in an output sound frame of M/x ms. The deficient sound frame at the end of the time scale, can be filled in by taking a section of the sound frame of the original sound signal and splicing it to the end of the deficient sound frame, i.e. by taking a sound frame from M/x to M/x+M ms of the original sound signal. Each sound frame must be added by a small region 20 of sound signal for cross fading, i.e. for linear addition. This is shown in FIG. 2. A section of a sound frame of an input sound signal shown as 16 is shortened to a length of 18 after the sampling points are proportionally reduced or the sampling frequency is increased. From the end of the sound frame 18 (not including the cross fading portion of 20), it is then matched to the original sound signal. This is shown in FIG. 2 as 22. The step is repeated for the remaining sections of the sound signal.

Figure 3:
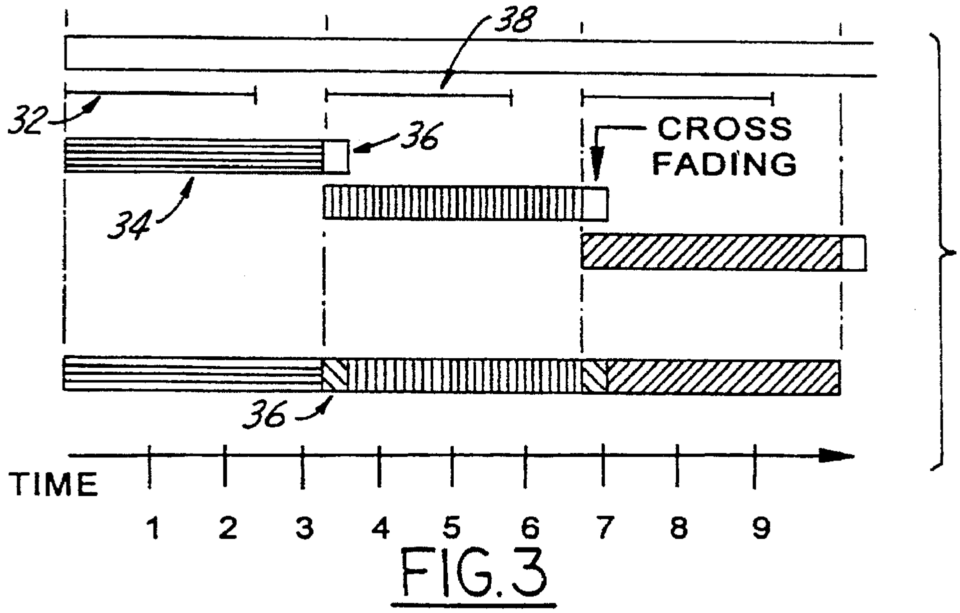
FIG. 3 is a diagram illustrating the present invention sound frame splicing method for decreasing the sound scale.

On the other hand, if the pitch of the sound signal is reduced resulting in a frequency drop of x times, the total playing time becomes xM ms. This is shown in FIG. 3. Similar to the above, at the end of sound playing by taking the corresponding position of the original sound signal, i.e., at the position of the original sound signal from xM to xM+M ms, a section of the sound frame is connected at the end of the sound output. A cross fading section is similarly performed at the interface of each sound frame. For instance, sound frame 32 is a section of the input sound signal which after increasing the sampling points or decreasing the sampling frequency increases in length to that shown as 34. At the tail end of sound frame 34, a small section 36 is used for cross fading. The tail end of sound frame 34 (not including the cross fading section 36) is then matched to the original sound signal indicated by sound frame 38 in FIG. 3. The step is repeated to complete the process.

Figure 4:
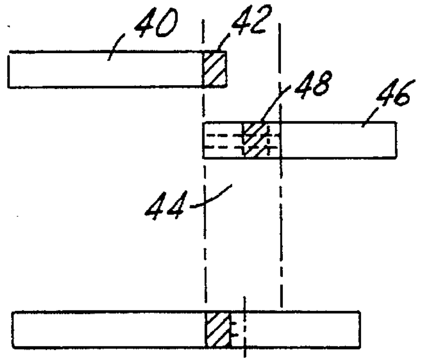
FIG. 4 is a diagram illustrating the ranges and the search method for finding the best splicing location for the sound frames.

In sound signals modified by the present invention method, the degree of change in the sound scale is related to the magnitude of the sound frame and the cross fading. Generally, the higher the pitch is modified to, the smaller is the length of the sound frame and the cross fading such that noticeable echo can be avoided. It has also been discovered that the longer the cross fading, the smaller is the noise produced. However, when the cross fading is too long, then the tone quality of the sound can suffer. Even though the cross fading method can be used to splice sound frames together for a smoother transition, noise can still be produced due to the relative position of the sound frames. It is therefore desirable to further improve the present invention by locating an area of the sound frame that is most similar to the other sound frame such that they can be spliced together without producing significant noise. A method for locating such positions is shown in FIG. 4. For instance, the small sound frame section 42 at the tail end of sound frame 40 is compared to the front section 44 of the second sound frame 46. The small section 42 shows the magnitude of the cross fading area which is smaller than the front section 44 of the sound frame 46. It is therefore necessary to find a similar section 48 within sound frame 46 in order to splice sound frame 46 with sound frame 40.

A mathematical method is proposed to find the most similar splicing area for sound frames. The method resides in calculating a differential mean absolute error (DMAE) of splicing which requires the least number of steps of calculation and thus producing the highest efficiency in splicing. The calculation is performed according to a function $$\begin{aligned} DMAE &= \sum_{m} |x_1(m) - x_2(m+\tau)| + \\ &\quad |x_1(m+1) - x_1(m) - x_2(m+1+\tau) - x_2(m+\tau)| \\ &= \sum_{m} |x_1(m) - x_2(m+\tau)| + \\ &\quad |x_1(m+1) - x_2(m+1+\tau) - [x_1(m) + x_2(m+\tau)]| \end{aligned}$$

where DMAE is the differential mean absolute error of splicing; m is any combination sum of points between 0 and cs, where cs is a cross fading size; $0 \leqq \tau < sr$, where sr is a search region; $x_1$ refers to the modified frame and $x_2$ refers to the non-modified frame. The more points of m, the better is quality of the sound. The location of the DMAE is the best splicing point for the sound frames. The calculation for DMAE only requires addition and subtraction which is a simple process since no multiplication is required.

In applying the DMAE method for locating the best splicing position, all the samples within the sound frame are calculated. It was discovered that since sound signals have certain regularity, the difference between any two adjacent points is very small. It is therefore possible to take one of each two points for the calculation in a subsampling method. By utilizing the subsampling method, the total number of calculations is reduced by half while the accuracy of the calculation is not noticeably affected. Table 1 shows the signal to noise ratio (SNR) calculated for a male voice, a violin sound and an electronic music by both the DMAE method and the DMAE/subsampling method.

TABLE 1

| SNR | DMAE | DMAE & Subsample |
|---|---|---|
| Male voice | 26.25415 | 26.20773 |
| Violin Sound | 31.56789 | 31.14602 |
| Electronic Music | 19.85814 | 19.737 |

As shown in Table 1, the SNR values obtained for the different sound signals by using the method with or without subsampling is not significantly affected. In an actual listening test, the differences could not be detected by a normal human ear. It is also possible to take one sampling point out of each three points or one sampling point out of each four points to further reduce the number of calculations, as long as the deviation from accuracy is within an allowable range.

Figure 5:
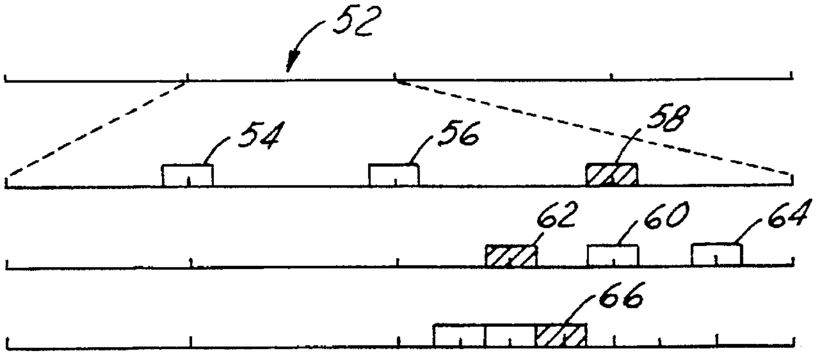
FIG. 5 is a diagram illustrating the present invention binary search method for finding the best splicing location.

In an alternate embodiment, the present invention further utilizes a method of motion estimation which is normally used in the treatment of moving images. By the further incorporation of the motion estimation method, the total number of calculations required to locate the DMAE can be greatly reduced. In other words, in a search for the best splicing location, a two dimensional method can be reduced to a unidimensional binary search method. To improve the accuracy of such search, the search region can be divided into many sections wherein the DMAE values of each region is determined. The various DMAE values are then compared and the smallest value is chosen as the optimum splicing location. This modified method is called block binary search and is shown in FIG. 5. One of the sound region is shown as 52. By dividing sound region 52 into four equal parts, wherein small sections 54, 56, and 58 each representing the ¼ region, the 2/4 region and the ¾ region. These regions are each determined for its DMAE value and then concluded that region 58 is the best matching location. A corresponding small section 60 is then used as the center location, and small region 62 at ⅛ ahead and small region 64 at ⅛ behind are determined for their most matching location. As shown in FIG. 5, the small region 62 at the ⅝ location was found to be the most matching. This method is successively performed until the three neighboring small regions are only one point away from each other such that the most matching location 66 is determined as the splicing location for the two sound frames.

Assuming that the search region is divided into n sections, the numbers of calculations required for locating each best matching point is $$n \cdot [3 + 2 \cdot (\log_2 MS/n - 2)]$$

wherein MS is the length of the search region. For instance, if $n=4$, $MS=10\ ms \times 22.05\ kHz=220.5$ By applying the block binary search method, the total number of calculations required is reduced to 42, which is only 20% of the original number of calculations. If the subsampling method is also adopted, then the total number of calculations can be again reduced to ½, i.e., to 10% of the original number of calculations.

The efficiency of calculation by a block binary search method is shown in Table 2. The signal to noise ratio determined for three different sound signals with or without the BBS method are shown which presented very small differences. These differences are not detectable by normal human hearing.

TABLE 2

| SNR | DMAE | DMAE & BBS | DMAE & BBS & Subsample |
|---|---|---|---|
| Male Voice | 26.25415 | 25.66386 | 25.32933 |
| Violin Sound | 31.56789 | 31.11732 | 31.06021 |
| Electronic Music | 19.85814 | 19.602.05 | 19.76816 |

The present invention therefore enables the change of sampling points by changing the playing rate of the sound. By the calculations demonstrated above, the modified sound can be played by the same playing rate without changing the pitch, while reducing or increasing the playing time. For instance, if the calculation of a certain sound signal involves increasing the amplitude, the data amount contained in the sound signal will increase. At the same playing rate, the total playing time would increase while maintaining the same amplitude. Conversely, if the calculation involves reducing the amplitude, the data mount in the sound signal will decrease which enables a shorter playing time while maintaining the same amplitude. Therefore, by utilizing the present invention method, a sound signal can be played faster or slower while maintaining the same pitch of the sound.

Figure 6:
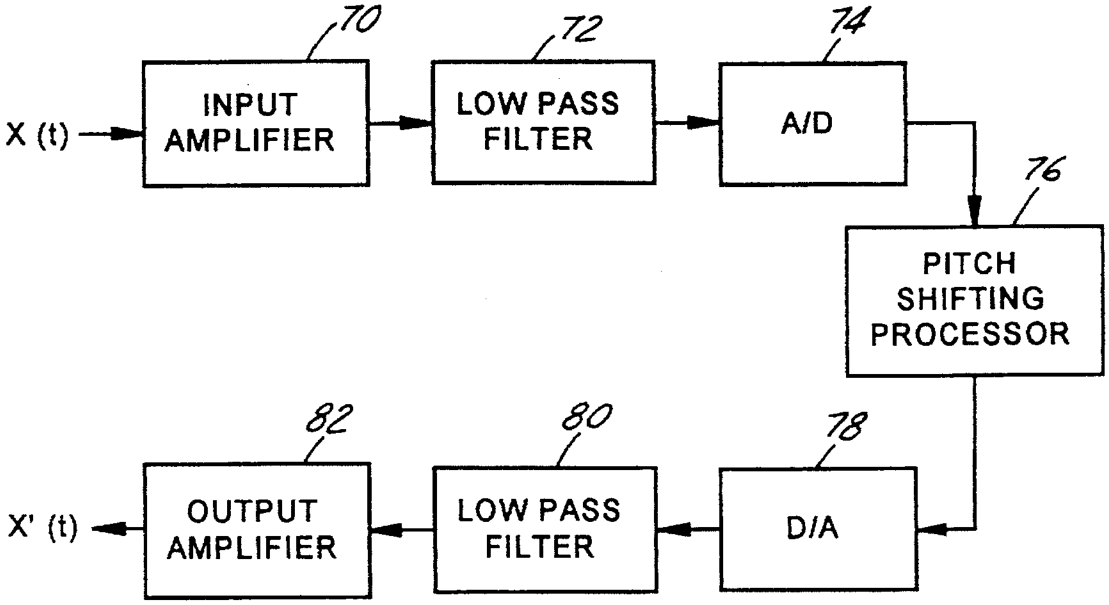
FIG. 6 is a block diagram showing an apparatus according to the present invention.

Sound signals are normally presented as analog signals. However, when these signals are processed, a digital processing method must be used. After the processing of the digital signals, they are transformed into analog signals again for output. FIG. 6 illustrates a block diagram for sound signal processing incorporating pitch modification. First, a microphone transforms sound into an analog electronic signal x(τ) for processing. The analog signal x(τ) is amplified by an input amplifier 70 to strengthen the signal. The amplified signal is then past through a low pass filter 72 for the elimination of noise signals. The filtered signal is sent through an analog/digital converter 74 to change the analog signals into digital signals. At this point, the digital signals are PCM signals which are sent through a pitch shifting processor 76 for processing. The processed signals are then sent through a digital/analog converter 78 to change the signals to analog signals. The analog signals are then sent through another low pass filter 80 and an output amplifier 82 for outputting through a speaker to audible sound having modified pitch.

Figure 7:
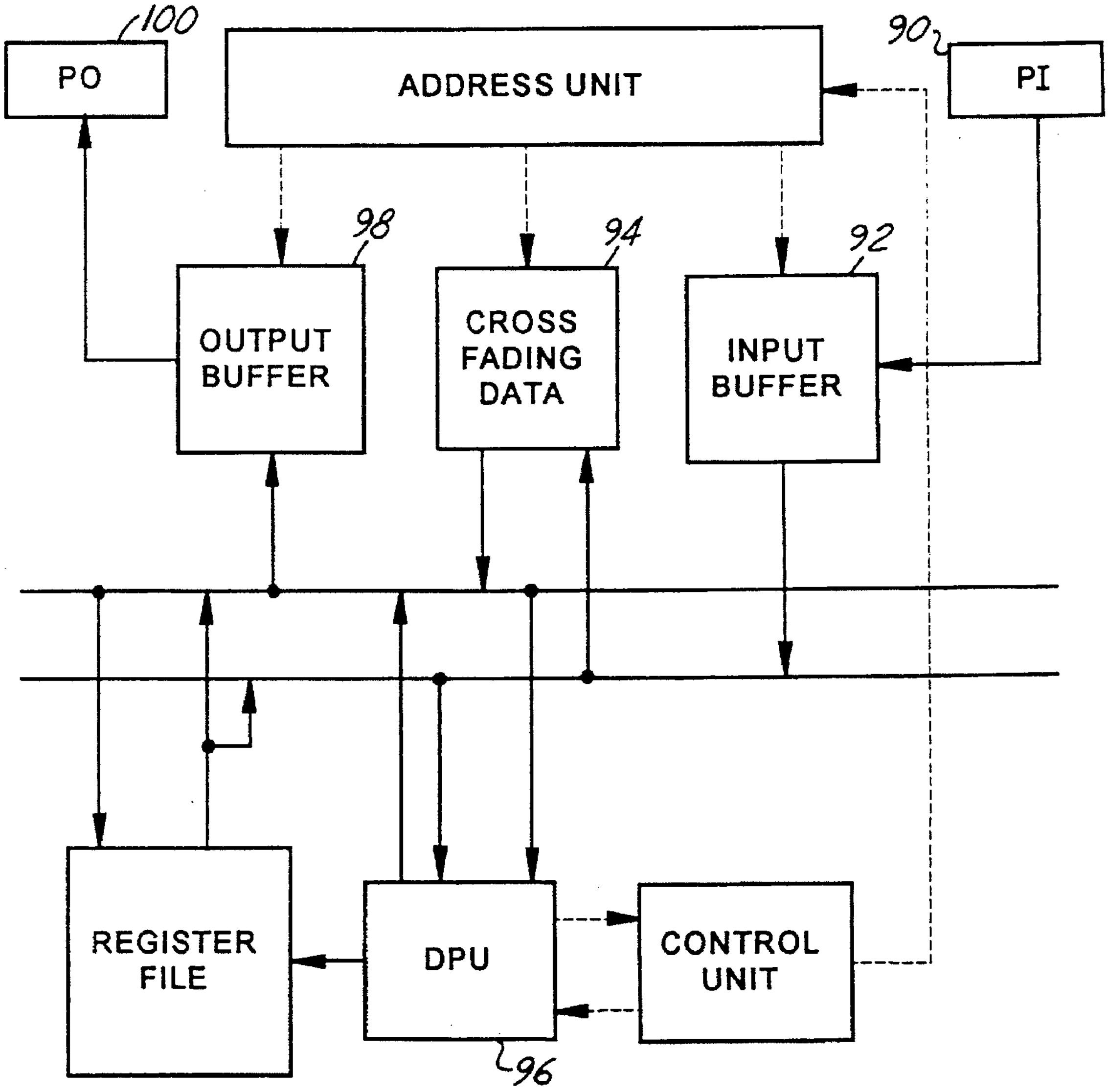
FIG. 7 is a block diagram of a pitch shifting processor of the apparatus of FIG. 6.

FIG. 7 illustrates the architecture of a pitch shifting processor. The sound data is sent through PI 90 into a input buffer 92. The cross fading data 94 stores the rear portion of the previous sound frame that requires cross fading. The DPU 96 is used for calculating DMAE and the cross fading value. The sound signals after processing are then sent to an output buffer 98 and PO 100 for external delivery.

While the present invention has been described in an illustrative manner, it should be understood that the terminology used is intended to be in a nature of words of description rather than of imitation.

Furthermore, while the present invention has been described in terms of preferred embodiment thereof, it is to be appreciated that those skilled in the art will readily apply these teachings to other possible variations of the invention.

The embodiments of the invention in which an exclusive property or privilege is claimed are defined as follows:

1. A method of modifying parameters of audio signals, comprising the steps of:

(a) converting an analog audio signal into a digital signal;

(b) dividing said digital signal into sound frames;

(c) modifying a pitch and playing rate of said digital signal within a frame to obtain a modified sound frame;

(d) splicing said modified sound frame with a non-modified sound frame, said non-modified sound frame overlapping an end region of said modified sound frame for cross fading with a portion thereof which has a similarity in sound structure to said end region, said similarity in sound structure being established by defining a differential mean absolute error of splicing requiring a least number of steps of calculations according to a function $$
\begin{aligned}
DMAE &= \sum_m |x_1(m) - x_2(m+\tau)| + \\
&\quad |x_1(m+1) - x_1(m) - x_2(m+1+\tau) - x_2(m+\tau)| \\
&= \sum_m |x_1(m) - x_2(m+\tau)| + \\
&\quad |x_1(m+1) - x_2(m+1+\tau) - [x_1(m) + x_2(m+\tau)]|
\end{aligned}
$$

wherein DMAE is the differential mean absolute error of splicing; m is any combination sum of points between 0 and cs, where cs is a cross fading size; $0 \leq \tau < Sr$, where sr is a search region; $x_1$ refers to the modified frame and $x_2$ refers to the non-modified frame;

(e) repeating steps (c), and (d) for said non-modified sound frame and for remaining non-modified sound flames of said digital signal to obtain a modified digital signal; and (f) converting said modified digital signal back into an analog form.

2. The method of modifying parameters of audio signals as claimed in claim 1, wherein, when said modifying step results in longer sound frames, and excessive non-modified sound frames of said non-modified sound frames are discarded to keep the playing time unchanged.

3. The method of modifying parameters of audio signals as claimed in claim 1, wherein, when said modifying step results in shorter sound frames, and then deficient sound frames are taken from the original digital signal to keep the playing time unchanged.

4. The method of modifying parameters of audio signals as claimed in claim 1, wherein said DMAE is defined for points which are nτ apart from each other, n is integer and depends on an allowable range of accuracy in calculations.

5. The method of modifying parameters of audio signals as claimed in claim 1, wherein a search region is divided into a number of sections, to further define said DMAE for each of said sections, compare said defined DMAEs to each other, and to choose a section with a smallest DMAE as an optimum splicing location.

6. The method of modifying parameters of audio signals as claimed in claim 5, wherein the number of calculations required for locating said section with a smallest DMAE is $$n[3+2(\log_2 MS/n-2)]$$

where n is the number of sections, MS is the length of said search region.

7. A method of modifying parameters of audio signals, comprising the steps of:

(a) converting an analog audio signal into a digital signal;

(b) dividing said digital signal into sound frames;

(c) modifying playing time of a frame to obtain a modified sound frame;

(d) splicing said modified sound frame with a non-modified sound frame, said non-modified sound frame overlapping an end region of said modified sound frame for cross fading with a portion thereof which has a similarity in sound structure to said end region, said similarity in sound structure being established by defining a differential means absolute error of splicing requiring a least number of steps of calculation according to a function $$\begin{aligned} DMAE &= \sum_m |x_1(m) - x_2(m+\tau)| + \\ &\quad |x_1(m+1) - x_1(m) - x_2(m+1+\tau) - x_2(m+\tau)| \\ &= \sum_m |x_1(m) - x_2(m+\tau)| + \\ &\quad |x_1(m+1) - x_2(m+1+\tau) - [x_1(m) + x_2(m+\tau)]| \end{aligned}$$

wherein DMAE is the differential mean absolute error of splicing; m is any combination sum of points between 0 and cs, where cs is a cross fading size; $0 \leqq \tau < Sr$, where sr is a search region; $x_1$ refers to the modified frame and $x_2$ refers to the non-modified frame;

(e) repeating steps (c) and (d) for non-modified sound frame and for remaining non-modified sound frames of said digital signal to obtain a modified digital signal; and (f) converting said modified digital signal back into an analog form.

8. The method of modifying parameters of audio signals as claimed in claim 7, wherein said modifying playing time includes increasing thereof where audio signal processing involves increasing sampling points of said audio signal, to thereby maintain a playing rate and sampling points of said audio signal unchanged.

9. The method of modifying parameters of audio signals as claimed in claim 7, wherein said modifying playing time includes decreasing thereof where audio signal processing involves decreasing sampling points of said audio signal, to thereby maintain a playing rate and sampling points of said audio signal unchanged.

10. The method of modifying parameters of audio signals as claimed in claim 7, wherein said DMAE is defined for points which are nτ apart from each other, n is integer and depends on an allowable range of accuracy in calculations.

11. The method of modifying parameters of audio signals as claimed in claim 7, wherein said search region is divided into a number of sections, to further define said DMAE for each of said sections, compare said defined DMAEs to each other, and to locate a section with a smallest DMAE as an optimum splicing location.

12. The method of modifying parameters of audio signals as claimed in claim 11, wherein a number of calculations required for locating said section with a smallest DMAE is $$n[3+2(\log_2 MS/n-2)]$$

where n is the number of sections, MS is the length of said search region.

13. An apparatus for modifying parameters of audio signals, comprising an input amplifier and an output amplifier, a first and a second low pass filters, an analog-to-digital converter, a digital-to-analog converter, and a pitch shifting processor, said pitch shifting processor comprising an input unit connected with an input buffer, an output unit connected with an output buffer, a cross fading data memory for storing portions of audio signals that require cross fading, an address unit connected with said input and said output buffers and said cross fading data memory, a register file unit, a digital processing unit for calculating mean absolute error and cross fading value, and a control unit, said input buffer, said cross fading data memory, said register file unit, said digital processing unit, said control unit, and said output buffer being operatively connected to each other through a bus system, said input amplifier, said first low pass filter, and said analog-to-digital converter being connected in series with said input unit of said pitch shifting processor, and said digital-to-analog converter, said second low pass filter, and said output amplifier being connected in series with said output unit of said pitch shifting processor.

* * * * *